(12) United States Patent
Tsuda

(10) Patent No.: US 6,800,931 B2
(45) Date of Patent: Oct. 5, 2004

(54) HEAT-DISSIPATING DEVICE OF A SEMICONDUCTOR DEVICE AND FABRICATION METHOD FOR SAME

(75) Inventor: Toshimasa Tsuda, Tokyo (JP)

(73) Assignee: NEC Corporation, Tokyo (JP)

(*) Notice: Subject to any disclaimer, the term of this patent is extended or adjusted under 35 U.S.C. 154(b) by 199 days.

(21) Appl. No.: 10/050,164

(22) Filed: Jan. 18, 2002

(65) Prior Publication Data

US 2002/0098622 A1 Jul. 25, 2002

(30) Foreign Application Priority Data

Jan. 19, 2001 (JP) .......................... 2001-011101

(51) Int. Cl.[7] .................. H01L 23/10; H01L 23/15
(52) U.S. Cl. ..................... 257/706; 257/717
(58) Field of Search ............... 257/625, 675, 257/706, 717, E23.101, E23.107, E23.108; 438/122

(56) References Cited

U.S. PATENT DOCUMENTS

| | | | | |
|---|---|---|---|---|
| 5,592,735 A | * | 1/1997 | Ozawa et al. ............... | 29/842 |
| 5,770,478 A | * | 6/1998 | Iruvanti et al. ............. | 438/122 |
| 6,005,771 A | * | 12/1999 | Bjorndahl et al. .......... | 361/699 |
| 6,028,354 A | * | 2/2000 | Hoffman ..................... | 257/706 |
| 6,163,456 A | * | 12/2000 | Suzuki et al. ............... | 361/704 |
| 6,610,560 B2 | * | 8/2003 | Pu et al. ...................... | 438/122 |
| 2001/0033010 A1 | * | 10/2001 | Tanioka et al. ............. | 257/675 |
| 2002/0011660 A1 | * | 1/2002 | Ebihara et al. ............. | 257/712 |

FOREIGN PATENT DOCUMENTS

JP          2000-150735          5/2000

* cited by examiner

Primary Examiner—W. David Coleman
(74) Attorney, Agent, or Firm—McGinn & Gibb, PLLC

(57) ABSTRACT

A heat-dissipating device of a semiconductor device is constituted by: first wiring substrate 1 on which semiconductor elements 7 are mounted; second wiring substrate 2 that supports the back side of first wiring substrate 1, which is the side of this substrate 1 that is opposite the first wiring substrate active surface 4; and heat dissipator 9 that is thermally and mechanically joined to the back surface of semiconductor elements 7, which is the surface of semiconductor elements 7 that is on the opposite side from the surface that confronts first substrate active surface 4. First wiring substrate 1 is electrically joined to second wiring substrate 2 by conductors 6 that extend in the planar direction of first substrate active area 4 from first substrate active surface 4 to electrical junction surface 5 of second wiring substrate 2. Conductors 6 extend linearly in a planar direction that does not bend in the layer direction and are therefore the minimum length. This minimization of length prevents deterioration of the harmonic propagation characteristic.

31 Claims, 2 Drawing Sheets

HEAT-DISSIPATING DEVICE OF A SEMICONDUCTOR DEVICE AND FABRICATION METHOD FOR SAME

BACKGROUND OF THE INVENTION

1. Field of the Invention

The present invention relates to a heat-dissipating device of a semiconductor device and to a method of manufacturing the semiconductor device, and more particularly to a heat-dissipating device of a semiconductor device, and method of fabricating the semiconductor device, in which the wiring substrate on which semiconductor chips are mounted is realized as a plurality of substrates, and further, which has a plurality of heat-dissipating structures.

2. Description of the Related Art

In conjunction with the advance in the number and variety of functions of semiconductor chips, which are assemblages of semiconductor elements (for example, LSI and IC), advances have been made in LSI packaging in which a plurality of substrates that secure semiconductor chips are electrically and mechanically joined to a wiring substrate. One issue that must be solved in such configurations, in which a wiring substrate and a group of LSI make up a single structure, is the occurrence of thermal stress that accompanies securing by mechanical joining.

The technique for solving this problem that is disclosed in Japanese Patent Laid-open No. 150735/2000 has received considerable attention. This known technique suppresses the occurrence of thermal stress by incorporating a heat-dissipating structure in a mechanically mounted structure that includes a first mounting body, in which semiconductor chips are mounted on a substrate, and a second mounting body in which the first mounting body is mounted on a wiring substrate. Although this known technique realizes the unified incorporation of a heat-dissipating structure in a two-layered mechanical structure, it apparently gives no information regarding the transmission characteristic of output signals that are outputted by chips.

A method is sought to suppress deterioration of the transmission characteristic of a multiple-structure package in which two types of substrates are joined and secured and which is provided with a heat-dissipating structure. A method is also sought to facilitate the assembly of this type of multiple-structure package.

SUMMARY OF THE INVENTION

It is an object of the present invention to provide a heat-dissipating device of a semiconductor device that can suppress deterioration of the transmission characteristic of a multiple-structure package in which two types of substrates are joined and secured and which is provided with a heat-dissipating structure. It is also an object of the present invention to provide a method of fabricating such a device.

A means of achieving this object is described hereinbelow. The technical items that appear in this description are assigned numbers or symbols in parentheses. These numbers or symbols coincide with the reference numbers or reference symbols that are assigned to the technical items that constitute at least one embodiment or a plurality of the working examples from among the plurality of embodiments or plurality of working examples of the present invention, and in particular, to the technical items that appear in the drawings that correspond to these embodiments or working examples. These reference numbers and reference symbols clarify the correspondence between and the technical items described in the claims and the technical items of the embodiments or working examples. However, this correspondence does not imply that the technical items described in the claims should be interpreted as being limited to the technical items of the embodiments or working examples.

A heat-dissipating device of a semiconductor device according to the present invention is constituted from:

a first wiring substrate (1) on which semiconductor elements (7) are mounted;

a second wiring substrate (2) that supports the back surface of the first wiring substrate 1, i.e., the surface of the first wiring substrate (1) that is on the opposite side from a first substrate active surface (4), which is the surface on which the semiconductor elements (7) are mounted;

a heat dissipator (9) that is thermally and mechanically joined to the back surfaces of the semiconductor elements 7, which are the surfaces of the semiconductor elements (7) that are on the opposite sides from the semiconductor element surfaces that confront the first substrate active surface (4); and conductors (6) that extend, in the planar direction of the first substrate active surface (4) or a plane that approaches that of the first substrate active surface (4), from said first substrate active surface (4) as far as an electrical junction surface (5) of the second wiring substrate [2].

The conductors (6) extend in a straight line (linearly) that does not bend in the direction of the layers (an orthogonal direction that is orthogonal to the first substrate active surface 4).

This definition means that the plane that contains the first substrate active surface (4) of the first wiring substrate (1) and the plane that contains the electrical junction surface (5) of the second wiring substrate 2 form the same plane, or that the plane that contains the first substrate active surface (4) of the first wiring substrate (1) and the plane that includes the electrical junction surface (5) of the second wiring substrate 2 are parallel and, moreover, are separated by a distance that approaches zero and is substantially zero. The length of the conductors (6) is therefore minimized, and the harmonic transmission characteristic is excellent.

In a heat-dissipating structure in which a heat dissipator (9), semiconductor elements (7), and the first wiring substrate (1) are stacked in this way, the conductors 6, which are geometrically limited because the electrical junction point area of the second wiring substrate 2 cannot overlap with the heat-dissipating structure, extend in a planar direction due to the three-dimensional arrangement in which the distance of separation in an orthogonal direction, which is orthogonal to the planar direction, between the first substrate active surface (4) and the electrical junction surface (5) is substantially close to zero, whereby the length of the conductors is minimized. A distance of separation that is substantially close to zero can be achieved because the distance is less than the thickness of the first wiring substrate 1.

The length of the conductors 6 does not include the distance between the edge of the first wiring substrate (1) and the edge of the second wiring substrate (2). As will be shown in FIG. 2 described hereinbelow, this reduced length can be achieved because the two edges are in contact. The first wiring substrate (1) is set into the second wiring substrate 2 in the previously described orthogonal direction. This insetting allows the distance of separation between the first substrate active surface (4) and the electrical junction surface (5) to approach zero.

The heat dissipator (9) is preferably joined to the semiconductor elements with a heat conductive adhesive layer 8 interposed. A stacked heat dissipator (12), which is thermally and mechanically joined with an interposed heat conductive buffer layer (11) to the heat-dissipating surface of the heat dissipator (9) on the side of the heat dissipator (9) that is opposite the side on which the semiconductor elements (7) are arranged; and supports (21), which support the stacked heat dissipator (12) on the first wiring substrate (1), are also added. This stacked heat dissipator (12) has a more extensive heat-dissipating surface than the heat dissipator (9).

The stacked heat dissipator (12) is supported by the first wiring substrate (1) but is not supported by the first wiring substrate (1) via the heat dissipator (9) and the semiconductor elements (7), and the semiconductor elements (7) therefore do not receive the stress imposed by a massive stacked heat dissipator (12). The supports (21) may be formed by a portion of the heat dissipator (9). Another heat conductive adhesive layer (22) is preferably provided between the supports (21) and the first wiring substrate (1).

Spacers (14) are interposed between the stacked heat dissipator (12) and the second wiring substrate (2). In addition to functioning as supports for supporting the stacked heat dissipator (12) on the second wiring substrate 2, these spacers (14) have the important function of fixing the distance of separation between the stacked heat dissipator (12) and the first wiring substrate (1) and preventing the thermal stress of the stacked heat dissipator 12 from being conveyed by direct propagation by way of the heat dissipator (9) to the semiconductor elements (7). To further ensure this function, it is important that a heat conductive buffer layer (11) be interposed between the stacked heat dissipator (12) and the supports (21). Still stronger joining between stacked heat dissipator (12) and second wiring substrate (2) can be obtained by means of bolts 15 that pass through these spacers due to the regulation of the distance of separation.

The area of the second wiring substrate (2) is greater than that of the first wiring substrate (1). The second wiring substrate (2) has a depression (3) in the orthogonal direction, which is orthogonal to the surface of the first substrate active surface (4); and the first wiring substrate (1) is set into this depression (3). Forming this depression (3) causes the previously described distance of separation to substantially approach zero. The depression 3 can be formed as an opening that penetrates in the previously described orthogonal direction.

An additional heat dissipator (17) is joined to the second wiring substrate 2. This additional heat dissipator (17) is thermally and mechanically joined to the periphery around the opening (3) in second wiring substrate (2). An additional heat conductive buffer layer (16) is preferably interposed between the first wiring substrate (1) and this additional heat dissipator (17). The heat conductive buffer layer (16) is arranged inside the opening (3). This heat conductive buffer layer (16) effectively absorbs the thermal stress of the additional heat dissipator (17) and suppresses the transmission of this thermal stress to the first wiring substrate (1).

The heat dissipator (9) is provided with: a plurality of joining portions for joining to the plurality of semiconductor elements (7); and a single main body portion that is both thermally and mechanically joined as a unit to this plurality of joining portions. Heat that is generated from the plurality of semiconductor elements (7) flows to the main body portion and is effectively dissipated by way of the heat-dissipating surface of the main body portion, and moreover, can be even more effectively dissipated by the extensive heat-dissipating surface (13) of the stacked heat dissipator (12) that is joined to the main body portion. A heat conductive buffer layer (11) is interposed in the heat conduction path of this heat dissipation and simultaneously absorbs heat and thermal stress. The semiconductor elements (7) are preferably joined to the joining portions with a first heat conductive adhesive layer (8) interposed.

It is particularly preferable that a second heat conductive adhesive layer (22) be interposed between the supports (21) and the first wiring substrate (1), and moreover, that spacers (14) be interposed between the stacked heat dissipator (12) and the second wiring substrate (2). As previously described, a more solid connection is preferably obtained between the stacked heat dissipator (12) and the second wiring substrate (2) by means of bolts that pass through the spacers (14).

The heat-dissipating device of a semiconductor device according to the present invention is thus constituted by a first heat-dissipating structure and a second heat-dissipating structure. The first heat-dissipating structure is provided with: the first wiring substrate (1), a plurality of semiconductor elements (7) that are mounted on the first wiring substrate (1), and a first heat dissipator (9) that is thermally and mechanically joined to the plurality of semiconductor elements (7). The second heat-dissipating structure is provided with: a second wiring substrate (2) and a second stacked heat dissipator (12) that is supported on the second wiring substrate (2). The first wiring substrate (1) is electrically connected to the second wiring substrate (2) by means of conductors (6) each having one end electrically joined to the first wiring substrate (1) and the other end electrically joined to the second wiring substrate (2).

The first substrate active surface (4) of the first wiring substrate (1), to which one end of each conductor is joined, is substantially parallel to the second substrate surface (5) of the second wiring substrate (2), to which the other end of each conductor is joined, and the effective distance between the plane that contains the first substrate active surface (4) and the plane that contains the second substrate surface (5) is substantially close to zero. The configuration of the arrangement of the plurality of wiring substrates that are incorporated within the multilayered heat-dissipating structure is flat, whereby a minimum length of conductors (6) can be realized within this flat structure. This flat structure can be defined by stipulating that the second wiring substrate (2) is not present between the first substrate surface (4) of the first wiring substrate (1) and the first heat dissipator (9). The effective distance can be defined as shorter than the thickness of the first wiring substrate 1.

The fabrication method of a semiconductor device according to the present invention is constituted by steps of:

mounting a plurality of semiconductor elements (7) on a first wiring substrate (1);

first joining for thermally and mechanically joining a first heat dissipator (9) to the plurality of semiconductor elements (7);

second joining for mechanically joining the first heat dissipator (9) to the first wiring substrate (1);

third joining for electrically joining the first wiring substrate (1) and the second wiring substrate (2) by conductors (6) that extend in a planar direction that is substantially parallel to the first substrate active surface (4) of the first wiring substrate (1) and the second substrate surface (5) of the second wiring substrate (2);

fourth joining for mechanically joining a second heat dissipator (12) to the second wiring substrate (2) with spacers (14) interposed; and fifth joining for thermally and mechanically joining a second heat dissipator (12) to the first heat dissipator (9).

The fabrication method that is stipulated as described above is consistent with an assembly method for assembling the previously described heat-dissipating device of the semiconductor device according to the present invention, and the order of this assembly need not correspond to the order in the description.

A step of forming a depression 3 in the second wiring substrate (2) in a direction that is orthogonal to the second substrate surface (5) of the second wiring substrate (2) is further added. The third joining step involves insetting the first wiring substrate (1) into this depression (3) to make the planar direction, in which conductors (6) extend, parallel to the first substrate active surface (4) of the first wiring substrate (1) and the second substrate surface (5) of the second wiring substrate (2). The second joining step involves joining the first heat dissipator (9) to the first wiring substrate (1) with a heat conductive adhesive layer (8) interposed. The fifth joining step involves joining the second heat dissipator (12) to the first heat dissipator (9) with a heat conductive buffer layer (11) interposed. As previously explained, a sixth joining step for joining a third heat dissipator (17) to the second wiring substrate (2) is also important. The sixth joining step involves joining the third heat dissipator (17) to the second wiring substrate (2) with a heat conductive buffer layer (16) interposed.

The above and other objects, features, and advantages of the present invention will become apparent from the following description based on the accompanying drawings, which illustrate examples of preferred embodiments of the present invention.

DETAILED DESCRIPTION OF THE PREFERRED EMBODIMENTS

Figure 1:
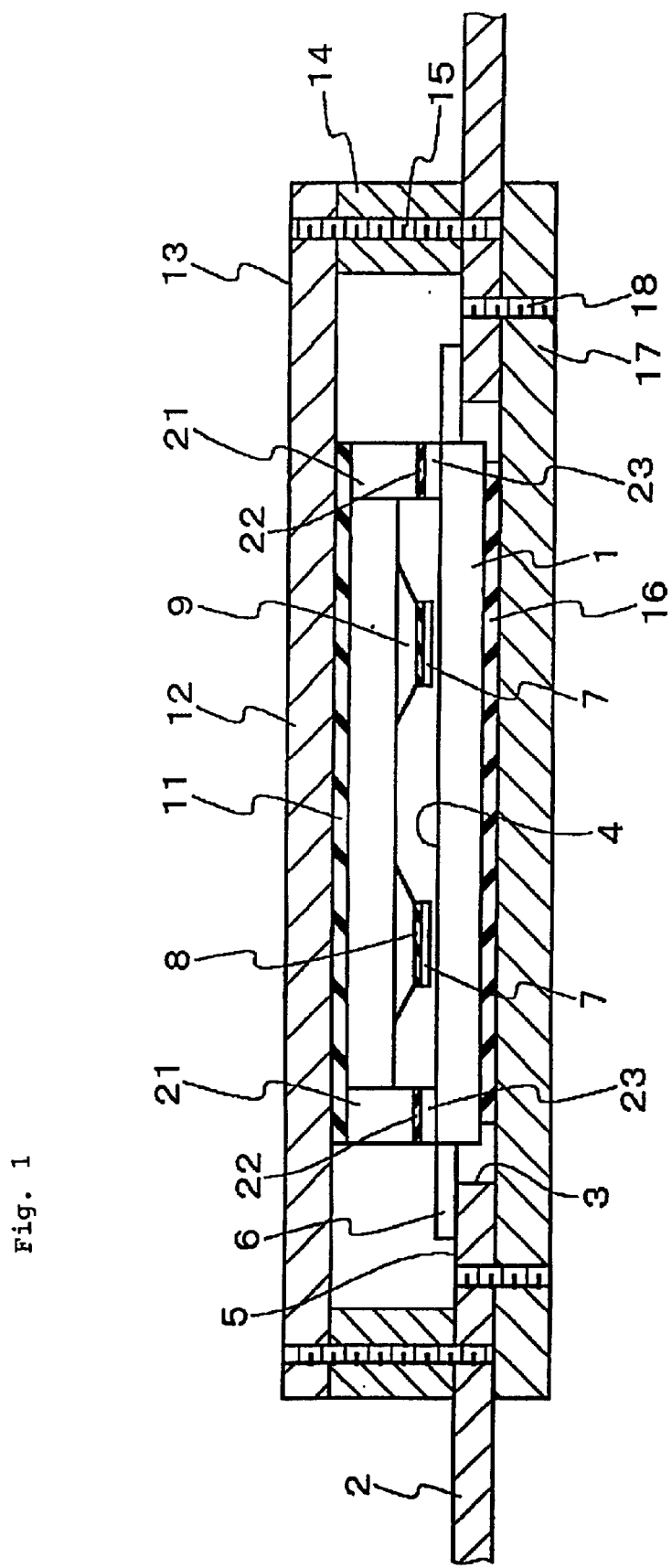
FIG. 1 is a sectional view showing an embodiment of the heat-dissipating device of a semiconductor device according to the present invention.

In accordance with the figures, an embodiment of the heat-dissipating device of a semiconductor device according to the present invention is provided with both wiring substrate 2 and semiconductor chip mounting substrate 1. This semiconductor chip mounting substrate 1 is arranged inside opening 3 of wiring substrate 2. Wiring substrate 2 can be formed as a multilayered substrate. First substrate active surface 4 of semiconductor chip mounting substrate 1 forms substantially the same plane as terminal junction surface 5 of wiring substrate 2; or first substrate active surface 4 of semiconductor chip mounting substrate 1 approaches terminal junction surface 5 of wiring substrate 2. The terminal surface on the semiconductor chip mounting substrate side, which forms a portion of first substrate active surface 4 of semiconductor chip mounting substrate 1, is electrically joined to the terminal junction surface 5 of wiring substrate 2 by external leads 6.

The plurality of semiconductor chips (for example, multifunction LSI) 7 are flipped and flip-mounted on the side of first substrate active surface 4 of semiconductor chip mounting substrate 1. First heat dissipator (heat sink) 9 is thermally and mechanically joined to the back surface (inactive surface) of semiconductor chips 7 with first heat conductive adhesive 8 interposed. First heat dissipator 9 is made up by a plurality of individual connection portions for individually connecting to the plurality of semiconductor chips 7 and a large-area heat dissipator main body that links and unites the plurality of individual connection portions.

Second heat dissipator 12 is joined to the back side of heat sink 9 with first silicon silicone sheet 11 interposed. First silicon silicone sheet 11 has a stress-absorbing property (elasticity) for absorbing the stress caused by the relative expansion and contraction between first heat dissipator 9 and second heat dissipator 12 and a heat-transfer property for transmitting the heat of first heat dissipator 9 to second heat dissipator 12; and silicone is used due its superior buffer effect. Second heat dissipator 12 includes an extensive second heat dissipator surface 13 as its exterior surface. Spacers 14 are interposed between wiring substrate 2 and second heat dissipator 12. Spacers 14 may be formed as a single unit with second heat dissipator 12. Second heat dissipator 12 is secured to wiring substrate 2 by first securing screws 15.

Third heat dissipator 17 is joined to the front surface of semiconductor chip mounting substrate 1 with second silicone sheet 16 interposed. Second silicone sheet 16 has a stress-absorbing property for absorbing the stress caused by the relative expansion and contraction between semiconductor chip mounting substrate 1 and third heat dissipator 17 and a heat-transfer property for transmitting the heat of semiconductor chip mounting substrate 1 to third heat dissipator 17. Third heat dissipator 17 is secured to wiring substrate 2 by second securing screws 18.

First heat dissipator 9 is formed as a single unit with side portions 21. Side portions 21 are joined to and supported by side portions 23, which are formed as a single unit with semiconductor chip mounting substrate 1 along the sides of semiconductor chip mounting substrate 1, with second heat conductive adhesive 22 interposed.

Semiconductor chip mounting substrate 1 is formed as a single structure together with semiconductor chips 7 and first heat dissipator 9 to form a first structure. This first structure incorporates First heat dissipator 9 and forms first heat-dissipating structure. The first structure together with the second heat dissipator 12, third heat dissipator 17, and wiring substrate 2 that sandwich it on both sides make up a single construction that forms a second structure. This second structure incorporates second heat dissipator 12 and third heat dissipator 17 to form a second heat-dissipating structure.

Semiconductor chip mounting substrate 1 of the first structure is arranged embedded in opening (hole) 3 of wiring substrate 2 of the second structure. The first structure and second structure that are in this relation are electrically joined by external leads 6 that are positioned on a plane that is parallel to first substrate active surface 4, and in particular, on the plane of first substrate active surface 4 or on a plane that approaches that of first substrate active surface 4. External leads 6 that realize this connection can thus extend linearly and their wiring length can be minimized. Minimizing this distance optimizes the transmission characteristic of harmonic signals.

The first heat-dissipating structure is made up by: semiconductor chip mounting substrate 1, a plurality of semiconductor chips 7, and first heat dissipator 9, semiconductor chip mounting substrate 1 being incorporated inside the first heat-dissipating structure. The second heat-dissipating structure is made up by wiring substrate 2, second heat dissipator 12, and third heat dissipator 17, wiring substrate 2 being incorporated inside the second heat-dissipating structure. The heat that is generated by the first heat-dissipating structure is conveyed to second heat dissipator 12 and third heat dissipator 17 by way of first silicone sheet 11 and second silicone sheet 16, and then discharged into the exterior atmosphere by way of the extensive second heat-dissipating surface 13 of second heat dissipator 12 and the extensive heat-dissipating surface of third heat dissipator 17.

The heat that is transmitted to second heat dissipator 12 generates thermal stress in second heat dissipator 12, and as a counter-reaction, there is a potential for this thermal stress to be transmitted to side portions 21. However, this thermal stress is effectively absorbed by first silicone sheet 11, which has a buffer effect, and the transmission of thermal stress by way of side portions 21 to semiconductor chip mounting substrate 1 is therefore suppressed. The thermal stress that is generated in second heat dissipator 12 is transmitted by way of spacers 14 to wiring substrate 2, but this thermal stress is absorbed in wiring substrate 2, whereby the concern far thermal stress being transmitted to semiconductor chips 7 is virtually eliminated.

The thermal stress that is generated in third heat dissipator 17 is effectively absorbed by second silicone sheet 16, and the transmission of this thermal stress to semiconductor chip mounting surface 1 is effectively suppressed. Semiconductor chips 7 are thus incorporated inside the first heat-dissipating structure in a floating state with respect to thermal stress, and the first heat-dissipating structure is incorporated inside the second heat-dissipating structure in a floating state with respect to thermal stress.

Although semiconductor chip mounting substrate 1, first heat dissipator 9, and second heat dissipator 12 are over-lapped and multilayered, the area within wiring substrate 2 in which external leads 6 are joined lies outside this overlapping-multilayered structure, and further, has a flat structure with respect to semiconductor chip mounting substrate 1. In other words, the previously described effective distance, which is the distance of the difference in level that external leads 6 curve in the direction of the layers, is shorter than the thickness of semiconductor chip mounting substrate 1 and substantially zero. The minimization of the length of external leads 6 in this flat structure as previously described allows the heat-dissipating device of the semiconductor device according to the present invention to have overlapping, multilayered heat-dissipating structures that do not detract from the harmonic transmission characteristic.

The fabrication method of the semiconductor device according to the present invention is realized as explained below. A plurality of semiconductor chips 7 is mounted on semiconductor chip mounting substrate 1. Next, first heat dissipator 9 is thermally and mechanically joined to the plurality of semiconductor elements 7 by way of heat conductive adhesive layer 8. A depression or opening 3 in a direction that is orthogonal to the substrate surface is next formed in wiring substrate 2. Semiconductor chip mounting substrate 1 is installed inside opening 3 of wiring substrate 2.

First heat dissipator 9 is next mechanically joined provisionally to semiconductor chip mounting substrate 1 with heat conductive adhesive layer 22 interposed. Semiconductor chip mounting substrate 1 and wiring substrate 2 are then electrically connected by conductors that extend in a direction within a plane that is substantially parallel to first substrate surface 4 of semiconductor chip mounting substrate 1 and second substrate surface 5 of wiring substrate 2.

Next, heat dissipator 9 is both thermally and mechanically joined to second heat dissipator 12 with heat conductive buffer layer 11 interposed. Second heat dissipator 12 is then mechanically joined to wiring substrate 2 with spacers 14 interposed.

Figure 2:
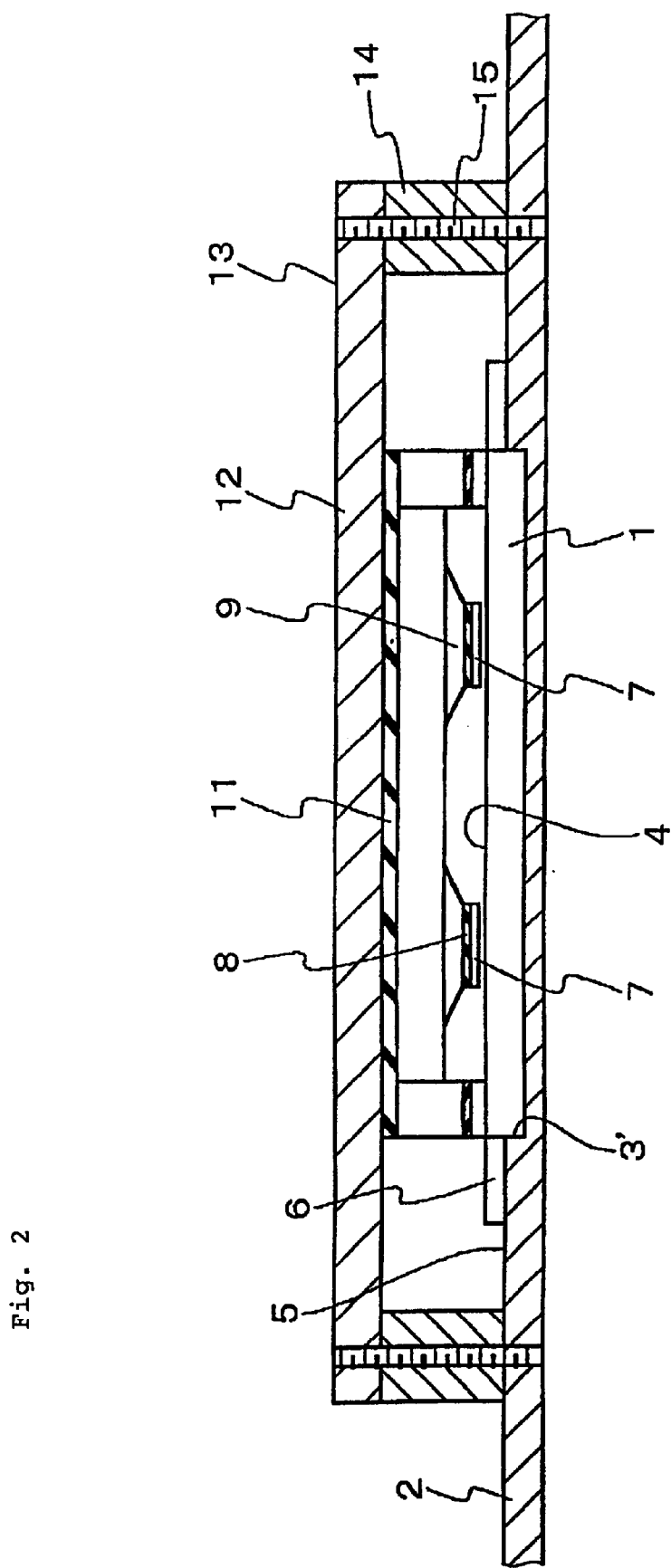
FIG. 2 is a sectional view showing another embodiment of the heat-dissipating device of a semiconductor device according to the present invention.

FIG. 2 shows another embodiment of the heat-dissipating device of a semiconductor device according to the present invention.

The thermal and mechanical joining relationship between semiconductor chips 7 and first heat dissipator 9, the thermal and mechanical joining relationship between first heat dissipator 9 and second heat dissipator 12 by way of first silicone sheet 11, and the thermal and mechanical joining relationship between wiring substrate 2 and second heat dissipator 12 by way of spacers 14 are each identical to the thermal and mechanical joining relationships of the previously described embodiment. Third heat dissipator 17 of the previously described embodiment has been omitted in this embodiment.

A point of difference exists between the joining relationship between semiconductor chip mounting substrate 1 and wiring substrate 2 in this embodiment and the relationship in the previously described embodiment.

Although the formation of opening 3' in wiring substrate 2 in this embodiment is equivalent to the formation of opening 3 in wiring substrate 2 in the previously described embodiment, the two embodiments differ in that, although a space is provided between opening 3 and semiconductor chip mounting substrate 1 of the previously described embodiment, no space is provided between the surface of the inner circumference of opening 3' and the surface of the outer circumference of semiconductor chip mounting substrate 1. This absence of a space further shortens the length of external leads 6 by the distance of this space.

The heat-dissipating device of a semiconductor device according to the present invention and the method of fabricating the semiconductor device minimizes the length of the connection lines that electrically join the wiring substrate within the heat-dissipating structure to another wiring substrate, and thus can suppress deterioration of the harmonic transmission characteristic.

While preferred embodiments of the present invention have been described using specific terms, such description is for illustrative purposes only, and it is to be understood that changes and variations may be made without departing from the spirit or scope of the following claims.

What is claimed is:

1. A heat-dissipating device of a semiconductor device, comprising:

a first wiring substrate on which semiconductor elements are mounted;

a second wiring substrate that supports the back surface of said first wiring substrate, i.e., the surface of said first wiring substrate that is on the opposite side from a first substrate active surface, which is the surface on which said semiconductor elements are mounted;

a heat dissipator that is thermally and mechanically joined to the back surfaces of said semiconductor elements, which are the surfaces of said semiconductor elements that are on the opposite side from said semiconductor element surfaces that confront said first substrate active surface; and conductors that extend from said first substrate active surface as far as an electrical junction surface of said second wiring substrate in the planar direction of said first substrate active surface or of a plane that approaches that of said first substrate active surface.

2. A heat-dissipating device of a semiconductor device according to claim 1, wherein the distance of separation, in an orthogonal direction that is orthogonal to said planar direction, between said first substrate active surface and said electrical junction surface is substantially zero.

3. A heat-dissipating device of a semiconductor device according to claim 2, wherein said distance of separation is shorter than the thickness of said first wiring substrate.

4. A heat-dissipating device of a semiconductor device according to claim 1, wherein the length of said conductors does not include the distance between the edge of said first wiring substrate and the edge of said second wiring substrate.

5. A heat-dissipating device of a semiconductor device according to claim 2, wherein the length of said conductors does not include the distance between the edge of said first wiring substrate and the edge of said second wiring substrate.

6. A heat-dissipating device of a semiconductor device according to claim 3, wherein the length of said conductors does not include the distance between the edge of said first wiring substrate and the edge of said second wiring substrate.

7. A heat-dissipating device of a semiconductor device according to claim 2, wherein said first wiring substrate is inset into said second wiring substrate in said orthogonal direction.

8. A heat-dissipating device of a semiconductor device according to claim 3, wherein said first wiring substrate is inset into said second wiring substrate in said orthogonal direction.

9. A heat-dissipating device of a semiconductor device according to claim 1, wherein said heat dissipator is joined to said semiconductor elements with a heat conductive adhesive layer interposed.

10. A heat-dissipating device of a semiconductor device according to claim 1, further comprising:
    a stacked heat dissipator that is thermally and mechanically joined by way of an interposed heat conductive buffer layer to a heat-dissipating surface of said heat dissipator that is the surface on the opposite side of said heat dissipator from the side on which said semiconductor elements are arranged; and
    supports that support said stacked heat dissipator upon said first wiring substrate;
    wherein said stacked heat dissipator has a more extensive heat-dissipating surface than said heat dissipator.

11. A heat-dissipating device of a semiconductor device according to claim 10, further comprising a heat conductive buffer layer that is interposed between said stacked heat dissipator and said supports.

12. A heat-dissipating device of a semiconductor device according to claim 10, wherein said supports are formed as a portion of said heat dissipator.

13. A heat-dissipating device of a semiconductor device according to claim 10, wherein another heat conductive adhesive layer is interposed in said supports.

14. A heat-dissipating device of a semiconductor device according to claim 11, wherein another heat conductive adhesive layer is interposed in said supports.

15. A heat-dissipating device of a semiconductor device according to claim 12, wherein another heat conductive adhesive layer is interposed in said supports.

16. A heat-dissipating device of a semiconductor device according to claim 10, further comprising spacers that are interposed between said stacked heat dissipator and said second wiring substrate.

17. A heat-dissipating device of a semiconductor device according to claim 11, further comprising spacers that are interposed between said stacked heat dissipator and said second wiring substrate.

18. A heat-dissipating device of a semiconductor device according to claim 12, further comprising spacers that are interposed between said stacked heat dissipator and said second wiring substrate.

19. A heat-dissipating device of a semiconductor device according to claim 13, further comprising spacers that are interposed between said stacked heat dissipator and said second wiring substrate.

20. A heat-dissipating device of a semiconductor device according to claim 16, wherein said stacked heat dissipator and said second wiring substrate are joined by bolts that pass through said spacers.

21. A heat-dissipating device of a semiconductor device according to claim 1, wherein:
    the area of said second wiring substrate is greater than the area of said first wiring substrate; said second wiring substrate has a depression in an orthogonal direction that is orthogonal to said first substrate active surface; and
    said first wiring substrate is set inside said depression.

22. A heat-dissipating device of a semiconductor device according to claim 21, wherein:
    said depression is formed as an opening that penetrates said second wiring substrate in said orthogonal direction;
    said heat-dissipating device of a semiconductor device further comprises an additional heat dissipator having a surface that confronts the surface of said first wiring substrate that is opposite said first substrate active surface;
    wherein said additional heat dissipator is thermally and mechanically joined to the periphery around said opening of said second wiring substrate; and
    said heat-dissipating device of a semiconductor device further comprises a heat conductive buffer layer that is interposed between said first wiring substrate and said additional heat dissipator;
    wherein said heat conductive buffer layer is arranged inside said opening.

23. A heat-dissipating device of a semiconductor device according to claim 1, wherein said heat dissipator is provided with:
    a plurality of joining portions for joining to a plurality of said semiconductor elements; and
    a single main body that is thermally and mechanically joined as a single unit with said plurality of joining portions.

24. A heat-dissipating device of a semiconductor device according to claim 23 wherein said first wiring substrate is set into said second wiring substrate in said orthogonal direction.

25. A heat-dissipating device of a semiconductor device according to claim 24 wherein said joining portions are joined to said semiconductor elements with an interposed first heat conductive adhesive layer.

26. A heat-dissipating device of a semiconductor device according to claim 25, further comprising:
    a stacked heat dissipator that is thermally and mechanically joined by way of an interposed heat conductive buffer layer to the surface on the side of said main body of said heat dissipator that is opposite the side on which said semiconductor elements are arranged; and supports that support said stacked heat dissipator on said first wiring substrate.

27. A heat-dissipating device of a semiconductor device according to claim 26, wherein a third heat conductive adhesive layer is interposed in said supports.

28. A heat-dissipating device of a semiconductor device according to claim 27, further comprising spacers that are interposed between said stacked heat dissipator and said second wiring substrate.

29. A heat-dissipating device of a semiconductor device according to claim 28, wherein said stacked heat dissipator and said second wiring substrate are joined by bolts that pass through said spacers.

30. A heat-dissipating device of a semiconductor device, comprising a first heat-dissipating structure and a second heat-dissipating structure; wherein:

said first heat-dissipating structure comprises:
a first wiring substrate;
a plurality of semiconductor elements that are mounted on said first wiring substrate; and
a first heat dissipator that is thermally and mechanically joined to said plurality of semiconductor elements said second heat-dissipating structure comprises:
a second wiring substrate; and
a second heat-dissipating device that is supported on said second wiring substrate;

said first wiring substrate is electrically connected to said second wiring substrate by way of conductors each having one end that is electrically joined to said first wiring substrate and the other end electrically joined to said second wiring substrate;

a first substrate surface of said first wiring substrate to which said one end is joined is substantially parallel to a second substrate surface of said second wiring substrate to which said other end is joined, and the effective distance between the plane that contains said first substrate surface and the plane that contains said second substrate surface substantially approaches zero; and said second wiring substrate is not present between said first substrate surface of said first wiring substrate and said first heat dissipator.

31. A heat-dissipating device of a semiconductor device according to claim 30, wherein said effective distance is shorter than the thickness of said first wiring substrate.

* * * * *